(12) United States Patent
Lee (10) Patent No.: US 9,166,200 B2
(45) Date of Patent: Oct. 20, 2015

(54) APPARATUS FOR MANUFACTURING ORGANIC LIGHT EMITTING DIODE DISPLAY AND METHOD FOR MANUFACTURING ORGANIC LIGHT EMITTING DIODE DISPLAY

(71) Applicant: Samsung Display Co., Ltd., Yongin, Gyeonggi-do (KR)

(72) Inventor: Jae-Hyuk Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 31 days.

(21) Appl. No.: 14/083,009

(22) Filed: Nov. 18, 2013

(65) Prior Publication Data

US 2014/0141551 A1  May 22, 2014

(30) Foreign Application Priority Data

Nov. 19, 2012  (KR) .......................... 10-2012-0131184

(51) Int. Cl.
*H01L 51/56* (2006.01)
*H01L 51/52* (2006.01)

(52) U.S. Cl.
CPC ............. *H01L 51/56* (2013.01); *H01L 51/5243* (2013.01); *Y10T 29/5313* (2015.01)

(58) Field of Classification Search
CPC .............. H10L 25/0753; B81C 99/002; Y10T 29/5313; H01L 51/56; H01L 51/5243

USPC ................. 438/28; 29/729; 313/506; 257/59, 257/E51.022; 156/326

See application file for complete search history.

(56) References Cited

U.S. PATENT DOCUMENTS

| 7,295,280 B2 | 11/2007 | Liou | |
|---|---|---|---|
| 2006/0021671 A1* | 2/2006 | Watanabe | 141/8 |
| 2012/0038705 A1* | 2/2012 | Madigan et al. | 347/20 |
| 2014/0004767 A1* | 1/2014 | Namkung | 445/16 |

FOREIGN PATENT DOCUMENTS

| JP | 2010-181776 | 8/2010 |
|---|---|---|
| KR | 10-0488295 | 4/2005 |

* cited by examiner

*Primary Examiner* — Selim Ahmed
*Assistant Examiner* — Changhyun Yi
(74) *Attorney, Agent, or Firm* — Knobbe Martens Olson & Bear LLP (57) ABSTRACT

A manufacturing apparatus of an OLED display includes: a mounter to which a substrate that includes a display area coated with a liquid layer including a thermally curable material and a non-display area neighboring the display area is mounted; a separator disposed on the substrate while contacting the non-display area of the substrate, and a separation space that separates the liquid layer and the substrate; and a heater configured to apply heat to the liquid layer.

15 Claims, 6 Drawing Sheets

APPARATUS FOR MANUFACTURING ORGANIC LIGHT EMITTING DIODE DISPLAY AND METHOD FOR MANUFACTURING ORGANIC LIGHT EMITTING DIODE DISPLAY

CROSS-REFERENCE TO RELATED APPLICATIONS

This application claims priority to and the benefit of Korean Patent Application No. 10-2012-0131184 filed in the Korean Intellectual Property Office on Nov. 19, 2012, the entire contents of which are incorporated herein by reference.

BACKGROUND

1. Field

The described technology relates generally to a manufacturing apparatus of an organic light emitting diode (OLED) display and a method for manufacturing the OLED display. More particularly, the described technology relates generally to a manufacturing apparatus of an OLED display of which a circuit board and an encapsulation substrate are sealed to each other using a sealant, and a method for manufacturing the OLED display.

2. Description of the Related Technology

A display device is a device displaying images. Recently, a display device including an organic light emitting diode has received more attention.

Since the OLED display has a self-emission characteristic and does not require a separate light source, unlike a liquid crystal display device, a thickness and a weight of the entire display device may be reduced. Further, the OLED display has high-definition characteristics such as low power consumption, high luminance, and a high response speed.

In general, an OLED display includes a circuit board where an organic light emitting element is formed, an encapsulation substrate disposed on the circuit board, a sealant sealing the circuit board and the encapsulation substrate, and a capping layer filling a space between the circuit board and the encapsulation substrate.

In manufacturing a conventional OLED display, a capping layer is formed by forming a liquid layer including a thermally curable material on an encapsulation substrate, sealing a circuit board to the encapsulation substrate, and then curing the liquid layer using heat, or formed by curing the liquid layer formed on the encapsulation substrate using heat before sealing the encapsulation substrate to the circuit board.

However, when the capping layer is formed by curing the liquid layer using heat after sealing the circuit board to the encapsulation substrate, an organic light emitting element formed in the circuit board is deteriorated due to the heat.

When the capping layer is formed by curing the liquid layer formed on the encapsulation substrate using heat before sealing the encapsulation substrate to the circuit board, gas generated from the liquid layer due to the heat is unexpectedly deposited to the encapsulation substrate, thereby causing a portion of the encapsulation substrate where the sealant is formed to be contaminated.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an OLED display that can prevent deterioration of an organic light emitting element and contamination of an encapsulation substrate caused by thermal curing of a liquid layer formed as a capping layer disposed between a circuit board and the encapsulation substrate, and a manufacturing method of an OLED display.

A first aspect of the present invention provides a manufacturing apparatus of an OLED display. The manufacturing apparatus includes: a mounter to which a substrate that includes a display area coated with a liquid layer including a thermally curable material and a non-display area neighboring the display area is mounted; a separator disposed on the substrate while contacting the non-display area of the substrate, configured to form a separation space that separates the liquid layer together with the substrate; and a heater configured to apply heat to the liquid layer.

The separator may include: a plurality of columns contacting the non-display area of the substrate and extended to an upper direction of the mounter; and a floater bent-extended from one column to the other column among the plurality of columns and separated from the substrate.

The column may include a buffer contacting the non-display area of the substrate.

The column and the floater may include metal, and the buffer may include at least one of silicon or a fluorine resin.

The floater may include at least one first penetration hole connected with the separation space, and the manufacturing apparatus may further include a capturing portion connected with the first penetration hole and configured to capture gas generated from the liquid layer and collected in the separation space.

The penetration hole may be shaped as an inverted triangle.

The heater may be disposed between the separator and the liquid layer and contacts the separator, and the heater may include a second penetration hole connected to the first penetration hole and the separation space.

The heater may be provide in the mounter.

The heater may be disposed between the separator and the liquid layer and contacts the separator.

The substrate may be an encapsulation substrate of the OLED display.

A second aspect of the present invention provides a method for manufacturing an OLED display. The method includes: mounting a substrate including a display area coated with a liquid layer that includes a thermally curable material and a non-display area neighboring the display area to a mounter; disposing a separator that forms a separation space for separating the liquid layer together with the substrate by contacting the non-display area of the substrate on the substrate; and curing the liquid layer by heating the liquid layer.

The method may further include: forming a sealant in the non-display area of the substrate; aligning the substrate to make the liquid layer face an organic light emitting element on a circuit board where the organic light emitting element is formed; and sealing the circuit board to the substrate using a sealant for the circuit board and the substrate seal the organic light emitting element together with the sealant.

According to certain embodiments, a manufacturing apparatus that can prevent deterioration of an organic light emitting element and contamination of an encapsulation substrate caused by thermal curing of a liquid layer formed as a capping layer disposed between a circuit board and the encapsulation substrate, and a manufacturing method of an OLED display.

DETAILED DESCRIPTION OF CERTAIN INVENTIVE EMBODIMENTS

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification.

A first embodiment will be representatively described using the same reference numerals for elements having the same configuration in a variety of embodiments, and in the other embodiments, only the elements other than those of the first embodiment will be described.

Further, the size and thickness of each component shown in the drawings are arbitrarily shown for understanding and ease of description, but the present invention is not limited thereto.

In the drawings, the thickness of layers, films, panels, regions, etc., may be exaggerated for clarity. In the drawings, for understanding and ease of description, the thickness of some layers and areas may be exaggerated.

In addition, unless explicitly described to the contrary, the word "comprise" and variations such as "comprises" or "comprising", will be understood to imply the inclusion of stated elements but not the exclusion of any other elements. In addition, in the specification, the word "on" means positioning on or below the object portion, but does not essentially mean positioning on the upper side of the object portion based on a gravity direction.

Hereinafter, a manufacturing apparatus of an organic light emitting diode (OLED) display according to a first embodiment will be described with reference to FIG. 1. Hereinafter, an encapsulation substrate refers to a substrate.

Figure 1:
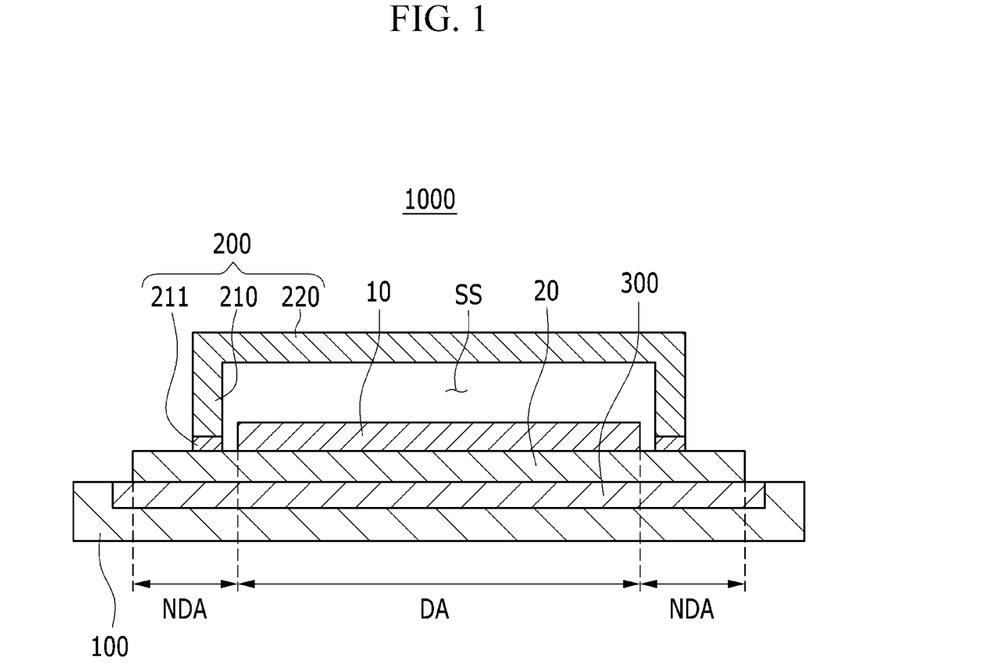
FIG. 1 shows a manufacturing apparatus of an organic light emitting diode (OLED) display according to a first embodiment.

FIG. 1 shows a manufacturing apparatus of an OLED display according to the first embodiment.

As shown in FIG. 1, a manufacturing apparatus 1000 of the OLED display according to the first embodiment may be an apparatus that forms a capping layer forming the OLED display by thermally curing a liquid layer 10 including a thermally curable material that is coated on an encapsulation substrate 20 that forms the OLED display, and includes a mounter 100, a separator 200, and heater 300.

The mounter 100 is a portion where the encapsulation substrate 20 is mounted. The encapsulation substrate 20 includes a display area DA coated with the liquid layer 10 and a non-display area DNA neighboring the display area DA. The display area DA of the encapsulation substrate 20 may be an area corresponding to an organic light emitting element that forms the OLED display, and the non-display area NDA may be an area where a sealant forming the OLED display is formed.

The separator 200 is disposed on the encapsulation substrate 20 on the mounter 100, and forms a separation space SS that isolates the liquid layer 10 together with the encapsulation substrate 20 by contacting the non-display area NDA of the encapsulation substrate 20. The separator 200 includes a column 210 and a floater 220.

The column 210 contacts the non-display area NDA of the encapsulation substrate 20, and extends to an upper side direction of the mounter 100. The column 210 is provided in plural, and the respective columns 210 are connected to each other to surround the edge of the display area DA of the encapsulation substrate 20. Each column 210 includes a buffer 211.

The buffer 211 is a portion contacting the non-display area NDA of the encapsulation substrate 20, and may include silicon or a fluorine resin in consideration of weakness of the encapsulation substrate 20 that includes a ceramic material such as glass and the like.

The floater 220 is extended in a bent manner from one column 210 to the other column 210 among the plurality of columns 210, and separated from the encapsulation substrate 20. That is, the floater 220 and the plurality of columns 210 may be integrally formed to be cap-shaped, and the floater 220 and column 210 may include a material such as Steel Us Stainless (SUS).

The heater 300 is provided in an inner side of the mounter 100, and heats the liquid layer 10 to form a capping layer from the liquid layer 10 by thermally curing the liquid layer 10 that includes a thermally curable material.

Hereinafter, a method for manufacturing an OLED display according to a second embodiment, using the manufacturing apparatus 1000 of the OLED display according to the first embodiment will be described with reference to FIG. 1 to FIG. 3.

Figure 2:
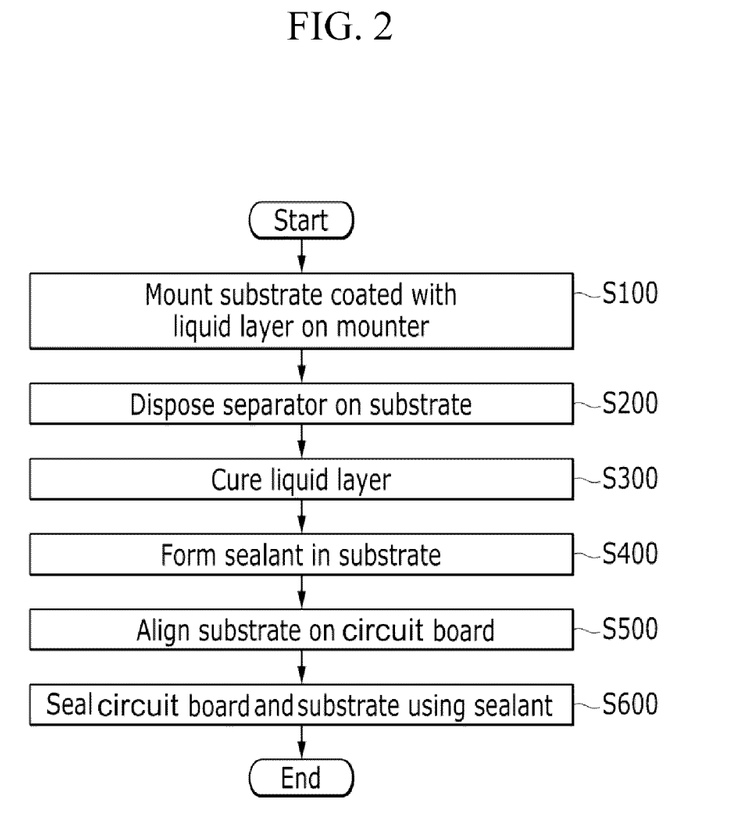
FIG. 2 is a flowchart of a method for manufacturing an OLED display according to a second embodiment.

FIG. 2 is a flowchart of a manufacturing method of the OLED display according to the second embodiment.

First, as shown in FIG. 1 and FIG. 2, the encapsulation substrate 20 coated with the liquid layer 10 is mounted to the mounter 100 (S100).

The encapsulation substrate 20 that includes the display area DA coated with the liquid layer 10 thermally curable material and the non-display area NDA is mounted to the mounter 100. The liquid layer 10 including the thermally curable material is coated to the display area DA of the encapsulation substrate 20 that includes the display area DA and the non-display area NDA and then the encapsulation substrate 20 coated with the liquid layer 10 is mounted to the mounter 100, or the encapsulation substrate 20 is mounted to the mounter 100 and then the liquid layer 10 is coated to the display area DA of the encapsulation substrate 20.

Next, the separator 200 is positioned on the encapsulation substrate 20 (S200).

The separator 200, forming a separation space SS for separation of the liquid layer 10 together with the encapsulation substrate 20 by contacting the non-display area NDA of the encapsulation substrate 20, is disposed on the encapsulation substrate 20. The buffer 210 of the column 210 of the separator 200 contacts the non-display area NDA of the encapsulation substrate 20.

Next, the liquid layer 10 is cured (S300).

The liquid layer is heated by using the heater 300 so as to cure the liquid layer 10. Since the liquid layer 10 is heated while in a state that the separator 200 contacts the non-display portion NDA and thus the liquid layer 10 is separated in the separation space SS, gas generated from the liquid layer 10 due to the heat is not deposited to the non-display area NDA of the encapsulation substrate 20. Since the gas generated from the liquid layer 10 is not deposited to the non-display area DNA of the encapsulation substrate 20, the non-display area DNA of the encapsulation substrate 20 can be prevented from being contaminated.

Figure 3:
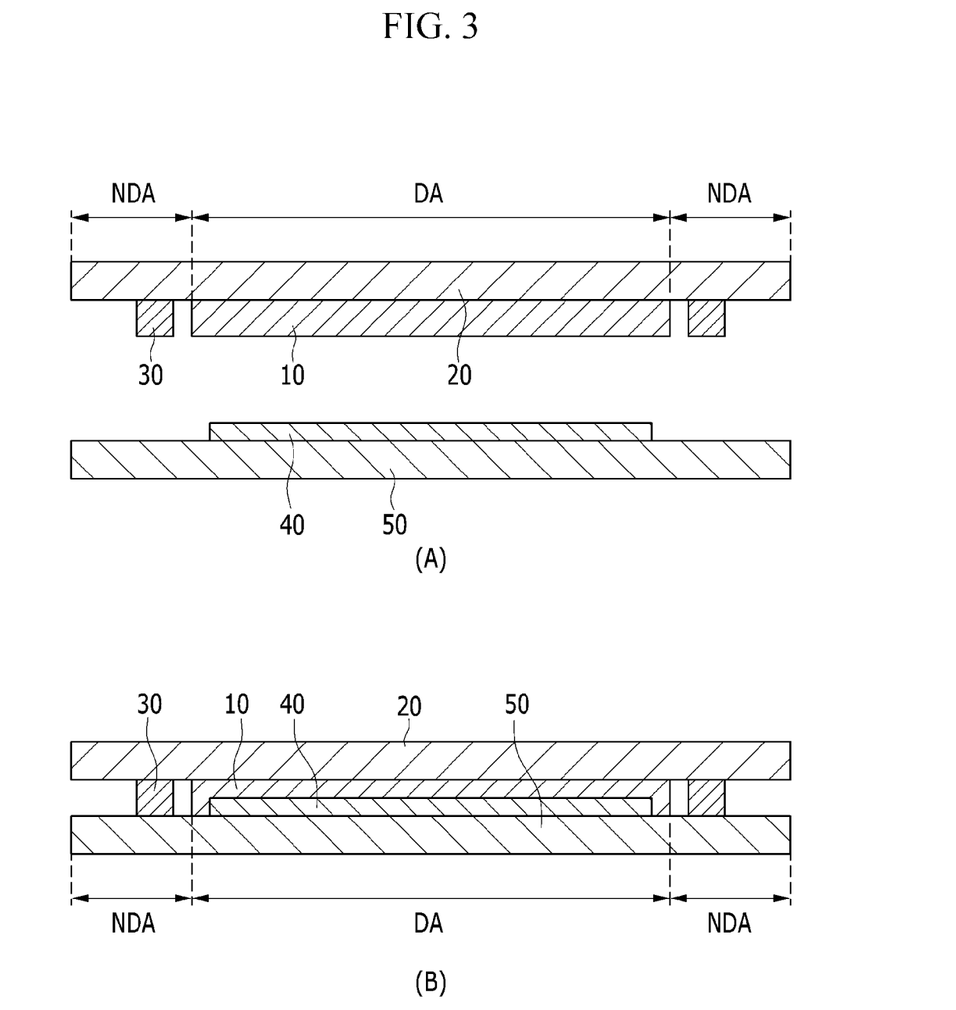
FIG. 3 is provided for description of a method for manufacturing the OLED display according to the second embodiment.

FIG. 3 is provided for description of the method for manufacturing an OLED display according to the second embodiment.

As shown in (A) of FIG. 3, the sealant 30 is formed in the encapsulation substrate 20 (S400).

The sealant 30 is formed in the non-display area NDA of the encapsulation substrate 20. Since the encapsulation substrate 20 is not contaminated, separation of the sealant 30 due to a contamination material can be prevented.

Next, the encapsulation substrate 20 is aligned on the circuit board 50 (S500).

The encapsulation substrate 20 is aligned for the liquid layer 10 to face an organic light emitting element 40 on the circuit board 50 where the organic light emitting element 40 is formed. The organic light emitting element 40 may include a pixel circuit including a plurality of thin film transistors and at least one capacitor, a first electrode connected to the pixel circuit, an organic emission layer disposed on the first electrode, and a second electrode disposed on the organic emission layer.

Then, as shown in (B) of FIG. 3, the circuit board 50 and the encapsulation substrate 20 are sealed to each other using the sealant 30 (S600).

The circuit board 50 and the encapsulation substrate 20 are sealed to each other using the sealant 30 to make the circuit board 50 and the encapsulation substrate 20 seal the organic light emitting element 40 together with the sealant 30. The thermally cured liquid layer 10 is disposed between the circuit board 50 and the encapsulation substrate 20 to function as a capping layer that covers the organic light emitting element 40.

As described, the manufacturing apparatus 1000 of the OLED display according to the first embodiment and the method for manufacturing the OLED display according to the second embodiment prevent deterioration of the organic light emitting element 40 and contamination of the encapsulation substrate 20 due to thermal curing of the liquid layer 10 formed as the capping layer disposed between the circuit board 50 and the encapsulation substrate 20 by thermally curing the liquid layer 10 while isolating the liquid layer 10 coated to the encapsulation substrate 20 in the separation space SS by the separator 200 that contacts the non-display area NDA of the encapsulation substrate 20. This acts as a factor for preventing the sealant 30 from being separated from the encapsulation substrate 20 due to contamination of the encapsulation substrate 20.

Hereinafter, a manufacturing apparatus of an OLED display according to a third embodiment will be described with reference to FIG. 4.

Only characteristic components distinguished from the first embodiment will be extracted and described, and the components omitted from the description follow the first embodiment. In addition, in the third embodiment, for convenience of description, like constituent elements will be described by using like reference numerals of the first embodiment.

Figure 4:
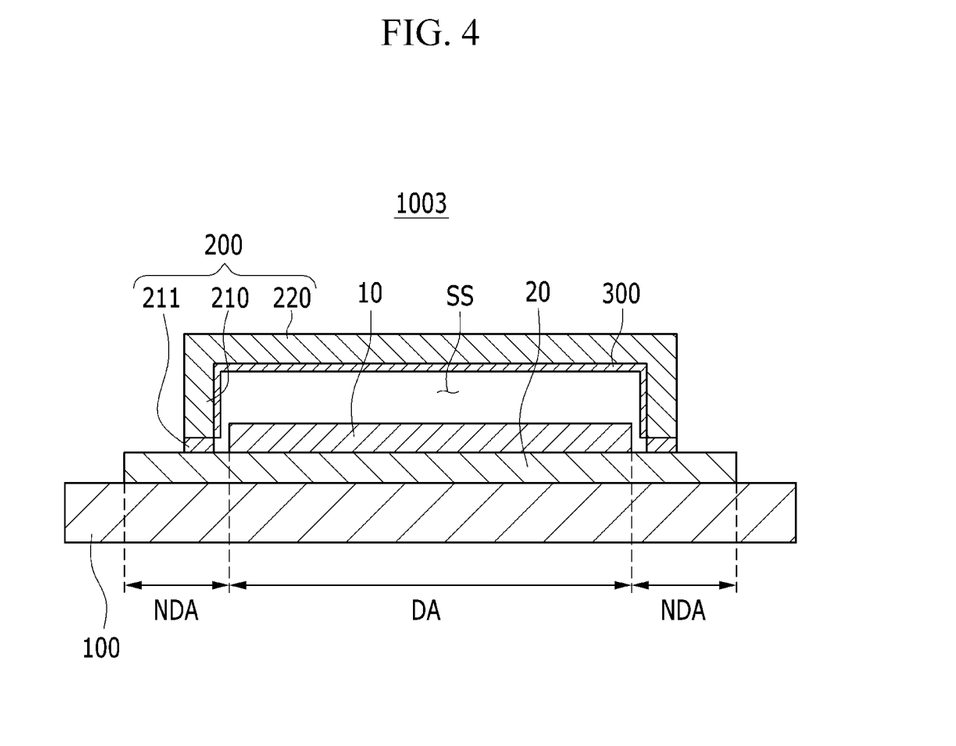
FIG. 4 shows a manufacturing apparatus of an OLED display according to a third embodiment.

FIG. 4 shows a manufacturing apparatus of an OLED display according to the third embodiment.

As shown in FIG. 4, a heater 300 of a manufacturing apparatus 1003 of the OLED display according to the third embodiment is provided between a separator 200 and a liquid layer 10 and thus contacts the separator 200. That is, the heater 300 contacts a separation space SS by being disposed in an inner side of the separator 200, and thermally cures the liquid layer 10 by directly applying heat to the liquid layer 10.

As described, in the manufacturing apparatus 1003 of the OLED display according to the third embodiment, the heater 300 that applies heat to the liquid layer 10 is disposed not in the mounter 100 but in an inner side of the separator 200 so that the liquid layer 10 coated to the encapsulation substrate 20 can be thermally cured using the separator 200 where the heater 300 is disposed even through the encapsulation substrate 20 mounted to the mounter 100.

According to the third embodiment, thermal curing can be performed to a liquid layer 10 coated to an encapsulation substrate 20 that is mounted to a mounter 100 formed in any shape so that generality of the manufacturing apparatus 1003 of the OLED display device can be improved.

Hereinafter, a manufacturing apparatus of an OLED display according to a fourth embodiment will be described with reference to FIG. 5.

Only characteristic components distinguished from the first embodiment will be extracted and described, and the components omitted from the description follow the first embodiment In addition, in the fourth embodiment, for convenience of description, like constituent elements will be described by using like reference numerals of the first embodiment.

Figure 5:
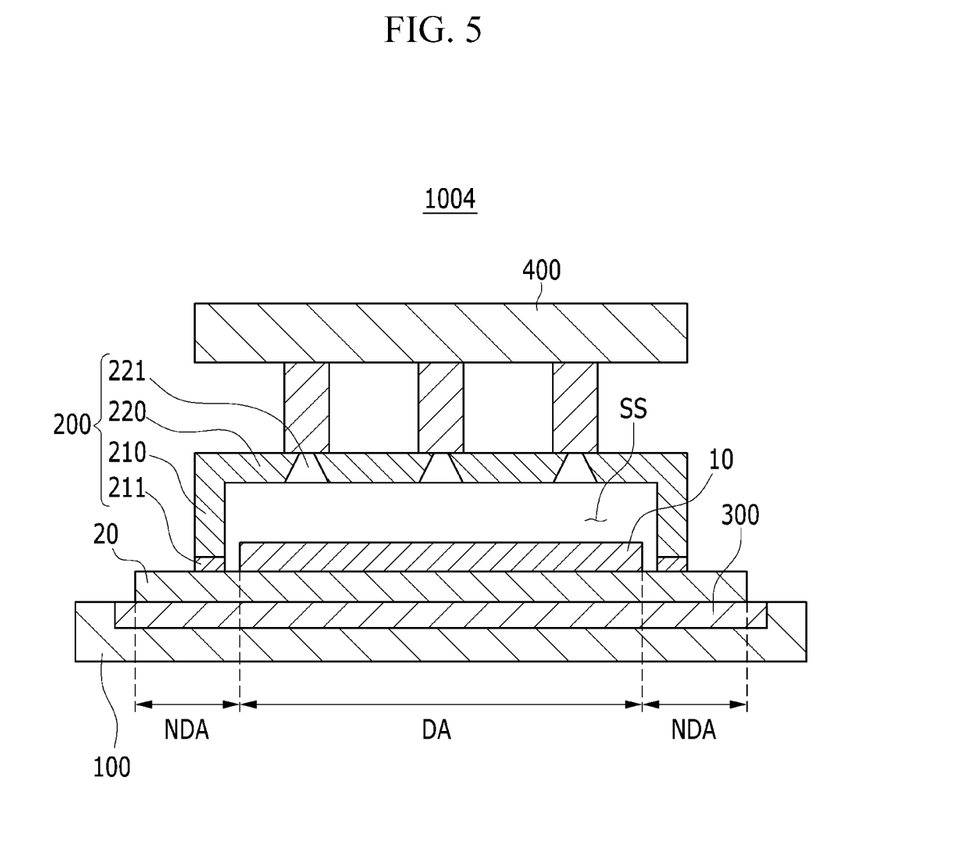
FIG. 5 shows a manufacturing apparatus of an OLED display according to a fourth embodiment.

FIG. 5 shows an OLED display according to the fourth embodiment.

As shown in FIG. 5, a manufacturing apparatus 1004 of the OLED display according to the fourth embodiment includes a mounter 100, a separator 200, a heater 300, and a capturing unit 400.

A floater 220 of the separator 200 includes at least one first penetration hole 221 connected with a separation space SS. The first penetration hole 221 is formed in the shape of an inverted triangle.

The capturing unit 400 is connected with the first penetration hole 221, and captures gas generated from the liquid layer 10 and gathered in the separation space SS.

As described, the manufacturing apparatus 1004 of the OLED display according to the fourth embodiment includes the separator 200 where the first penetration hole 221 connected with the separation space SS where the liquid layer 10 is formed, and the capturing portion 400 connected with the first penetration hole 221. Gas generated from the liquid layer 10 during thermal curing of the liquid layer 10 to the outside through the first penetration hole 221 and the capturing portion 400 and accordingly contamination of the encapsulation substrate 20 caused by the gas generated from the liquid layer 10 can be prevented. This acts as a factor for preventing separation of the sealant 30 from the encapsulation substrate 20 due to contamination of the encapsulation substrate 20.

Hereinafter, a manufacturing apparatus of an OLED display according to a fifth embodiment will be described with reference to FIG. 6.

Only characteristic components distinguished from the first embodiment will be extracted and described, and the components omitted from the description follow the first embodiment. In addition, in the fifth embodiment, for convenience for the description, like constituent elements will be described by using like reference numerals of the first embodiment.

Figure 6:
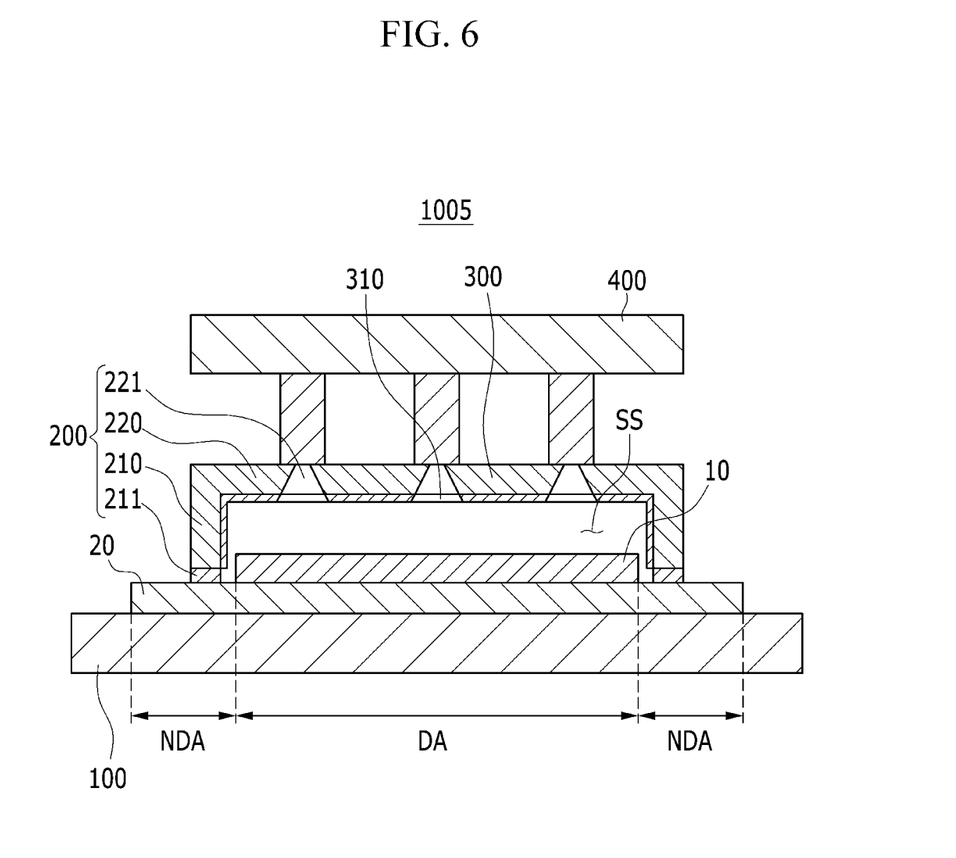
FIG. 6 shows a manufacturing apparatus of an OLED display according to a fifth embodiment.

FIG. 6 shows an OLED display according to the fifth embodiment.

As shown in FIG. 6, a manufacturing apparatus 1005 of the OLED display according to the fifth embodiment includes a mounter 100, a separator 200, a heater 300, and a capturing portion 400.

A floater 220 of the separator 200 includes at least one first penetration hole 221 connected with a separation space SS. The first penetration hole 221 is formed in the shape of an inverted triangle.

The capturing portion 400 is connected with the first penetration hole 221, and captures gas generated from the liquid layer 10 and gathered in the separation space SS.

The heater 300 is disposed between the separator 200 and the liquid layer 10 and contacts the separator 200. The heater 300 is disposed in an inner side of the separator 200 and contacts the separation space SS, and thermally cures the liquid layer 10 by directly applying heat to the liquid layer 10. The heater 300 includes a first penetration hole 221 and a second penetration hole 310 that is disposed between the first penetration hole 221 and the separation space SS, and connected with the first penetration hole 221 and the separation space SS.

As described, in the manufacturing apparatus 1005 of the OLED display according to the fifth embodiment, the heater 300 that applies heat to the liquid layer 10 is disposed not in the mounter 100 but in an inner side of the separator 200 so that the liquid layer 10 coated to the encapsulation substrate 20 can be thermally cured using the separator 200 where the heater 300 is disposed even through the encapsulation substrate 20 mounted to the mounter 100.

That is, according to the fifth embodiment, thermal curing can be performed to a liquid layer 10 coated to an encapsulation substrate 20 that is mounted to a mounter 100 formed in any shape so that generality of the manufacturing apparatus 1005 of the OLED display device can be improved.

In addition, the manufacturing apparatus 1005 of the OLED display according to the fifth embodiment includes the heater 300 where the second penetration hole 310 connected with the separation space SS where the liquid layer 10 is disposed is formed, the separator 200 where the first penetration hole 221 connected with the separation space SS through the second penetration hole 310 is formed, and the capturing portion 400 connected with the first penetration hole 221. Gas generated from the liquid layer 10 during thermal curing of the liquid layer 10 formed as the capping layer disposed between the circuit board 50 and the encapsulation substrate 20 can be emitted to the outside through the second penetration hole 310, the first penetration hole 221, and the capturing portion 400, thereby preventing contamination of the encapsulation substrate 20 caused by the gas generated from the liquid layer 10. This acts as a factor for preventing the sealant 30 from being separated from the encapsulation substrate 20 due to contamination of the encapsulation substrate 20.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing apparatus of an organic light emitting diode (OLED) display comprising:
   a mounter to which a substrate is mounted, the substrate including a display area coated with a liquid layer including a thermally curable material and a non-display area neighboring the display area;
   a separator disposed on the substrate while contacting the non-display area of the substrate, configured to form a separation space that separates the liquid layer and the substrate; and
   a heater configured to apply heat to the liquid layer.

2. The manufacturing apparatus of the OLED display of claim 1, wherein the separator comprises:
   a plurality of columns contacting the non-display area of the substrate and extended to an upper direction of the mounter; and
   a floater bent-extended from one column to another column among the plurality of columns and separated from the substrate.

3. The manufacturing apparatus of the OLED display of claim 2, wherein the column comprises a buffer contacting the non-display area of the substrate.

4. The manufacturing apparatus of the OLED display of claim 3, wherein the column and the floater comprise metal, and the buffer comprises at least one of silicon or a fluorine resin.

5. The manufacturing apparatus of the OLED display of claim 2, wherein the floater comprises at least one first penetration hole connected with the separation space, and the manufacturing apparatus further comprises a capturing portion connected with the first penetration hole and configured to capture gas generated from the liquid layer and collected in the separation space.

6. The manufacturing apparatus of the OLED display of claim 5, wherein the penetration hole is shaped in an inverted triangle.

7. The manufacturing apparatus of claim 5, wherein the heater is disposed between the separator and the liquid layer and contacts the separator, and the heater comprises a second penetration hole connected to the first penetration hole and the separation space.

8. The manufacturing apparatus of the OLED display of claim 1, wherein the heater is provided in the mounter.

9. The manufacturing apparatus of the OLED display of claim 1, wherein the heater is disposed between the separator and the liquid layer and contacts the separator.

10. The manufacturing apparatus of the OLED display of claim 1, wherein the substrate is an encapsulation substrate of the OLED display.

11. A method for manufacturing an organic light emitting diode (OLED) display using the manufacturing apparatus of the OLED display of claim 1, comprising:
    mounting the substrate to the mounter;
    disposing the separator on the substrate by contacting the non-display area of the substrate on the substrate; and
    curing the liquid layer by heating the liquid layer.

12. The method for manufacturing the OLED display of claim 11, further comprising:
    forming a sealant in the non-display area of the substrate;
    aligning the substrate to make the liquid layer face an organic light emitting element on a circuit board where the organic light emitting element is formed; and
    sealing the circuit board to the substrate using a sealant for the circuit board and the substrate seal the organic light emitting element together with the sealant.

13. A manufacturing apparatus of an organic light emitting diode (OLED) display comprising:
    a mounter to which a substrate is mounted, the substrate including a display area coated with a liquid layer including a thermally curable material and a non-display area neighboring the display area;
    a separator disposed on the substrate while contacting the non-display area of the substrate, configured to form a separation space that separates the liquid layer and the substrate, wherein the separator comprises:
       a plurality of columns contacting the non-display area of the substrate and extended to an upper direction of the mounter, and a floater bent-extended from one column to another column among the plurality of columns and separated from the substrate, wherein each column comprises a buffer contacting the non-display area of the substrate; and a heater configured to apply heat to the liquid layer.

14. A manufacturing apparatus of an organic light emitting diode (OLED) display comprising:
- a mounter to which a substrate is mounted, the substrate including a display area coated with a liquid layer including a thermally curable material and a non-display area neighboring the display area;
- a separator disposed on the substrate while contacting the non-display area of the substrate, configured to form a separation space that separates the liquid layer and the substrate, wherein the separator comprises:
  - a plurality of columns contacting the non-display area of the substrate and extended to an upper direction of the mounter, and
  - a floater bent-extended from one column to another column among the plurality of columns and separated from the substrate, wherein the floater comprises at least one first penetration hole connected with the separation space;
- a capturing portion connected with the first penetration hole and configured to capture gas generated from the liquid layer and collected in the separation space; and
- a heater configured to apply heat to the liquid layer.

15. A manufacturing apparatus of an organic light emitting diode (OLED) display comprising:
- a mounter to which a substrate is mounted, the substrate including a display area coated with a liquid layer including a thermally curable material and a non-display area neighboring the display area;
- a separator disposed on the substrate while contacting the non-display area of the substrate, configured to form a separation space that isolates the liquid layer together with the substrate; and
- a heater configured to apply heat to the liquid layer.

* * * * *